United States Patent
Ushiki et al.

(10) Patent No.: US 6,632,703 B2
(45) Date of Patent: *Oct. 14, 2003

(54) METHOD AND APPARATUS FOR POSITIONING A SEMICONDUCTOR PELLET

(75) Inventors: Hiroshi Ushiki, Iruma (JP); Hirofumi Moroe, Musashimurayama (JP)

(73) Assignee: Kabushiki Kaisha Shinkawa, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,674

(22) Filed: Apr. 21, 1999

(65) Prior Publication Data

US 2002/0175202 A1 Nov. 28, 2002

(30) Foreign Application Priority Data

Apr. 21, 1998 (JP) ............................................. 10-126702

(51) Int. Cl.⁷ ............................................... H01L 23/32
(52) U.S. Cl. ......................... 438/106; 438/975; 414/941
(58) Field of Search ................................ 438/106, 617, 438/975, FOR 343; 414/816, 936, 941

(56) References Cited

U.S. PATENT DOCUMENTS

| | | | | |
|---|---|---|---|---|
| 4,682,928 A | * | 7/1987 | Foulke et al. | |
| 4,892,455 A | * | 1/1990 | Hine | |
| 5,513,948 A | * | 5/1996 | Bacchi et al. | |
| 5,534,073 A | * | 7/1996 | Kinoshita et al. | |
| 5,961,169 A | * | 10/1999 | Kalenian et al. | |
| 6,063,440 A | * | 5/2000 | Chen et al. | |
| 6,123,502 A | * | 9/2000 | Adams et al. | |
| 6,216,883 B1 | * | 4/2001 | Kobayashi et al. | |
| 6,217,272 B1 | * | 4/2001 | Felsenthal et al. | |
| 6,270,582 B1 | * | 8/2001 | Rivkin et al. | |
| 6,290,274 B1 | * | 9/2001 | Montoya | |

FOREIGN PATENT DOCUMENTS

| | | |
|---|---|---|
| JP | H2-244735 A | 9/1990 |
| JP | H4-61241 A | 2/1992 |
| JP | H4-312936 A | 11/1992 |
| JP | H7-86286 A | 3/1995 |

\* cited by examiner

*Primary Examiner*—George Fourson
*Assistant Examiner*—Joannie Adelle Garcia
(74) *Attorney, Agent, or Firm*—Koda & Androlia

(57) ABSTRACT

Method and apparatus for suction-holding a semiconductor pellet on a positioning stage of a bonding apparatus without causing the pellet to be misaligned after positioning thereof including a suction force control device. The suction force control device comprises a suction-switching electromagnetic valve, a suction force-adjusting electromagnetic valve, a vacuum source, a compressed air source and a throttle valve so that a semiconductor pellet is held on a positioning stage by a suction force that is weak enough that a positioning claw can move the semiconductor pellet for positioning; and upon completion of the positioning, the semiconductor pellet is held to the positioning stage by a suction force that is stronger than the weak suction force used for positioning.

1 Claim, 6 Drawing Sheets

METHOD AND APPARATUS FOR POSITIONING A SEMICONDUCTOR PELLET

BACKGROUND OF THE INVENTION

1. Field of Invention

The present invention relates to a method and apparatus for positioning semiconductor pellet in a die bonding apparatus, tape bonding apparatus, bump bonding apparatus or the like.

2. Prior Art

In a die bonding apparatus, tape bonding apparatus, bump bonding apparatus or the like, a semiconductor pellet is removed from a tray or wafer and placed on a positioning stage, and once placed on this positioning stage, the semiconductor pellet is positioned by a positioning claw. After this, in a die bonding apparatus, the semiconductor pellet is bonded to a lead frame. In a tape bonding apparatus, the semiconductor pellet is bonded to a carrier tape. In a bump bonding apparatus, a bump is formed on an electrode of the semiconductor pellet. In other words, in these bonding apparatuses, the semiconductor pellet is positioned prior to bonding or the formation of a bump.

Operations in these bonding apparatuses will be described below in more detail.

Figure 5:
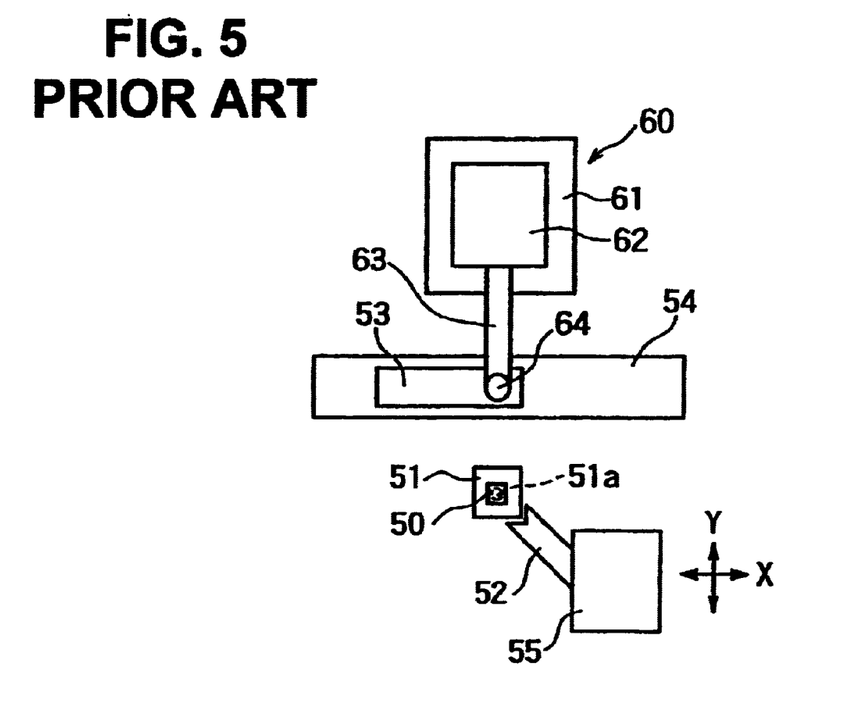
FIG. 5 is a schematic top view of a die bonding apparatus.

As shown in FIG. 5, a die bonding apparatus has a positioning stage 51 for holding a semiconductor pellet 50 by means of a suction hole 51a, a positioning claw 52 for positioning the semiconductor pellet 50 on the positioning stage 51, a frame feeder 54 for conveying and positioning a lead frame 53, and a bonding device 60 for bonding the semiconductor pellet 50 to the lead frame 53. The positioning claw 52 is provided on an XY table 55 which is driven in the X and Y directions. In the bonding device 60, a bonding head 62 is mounted on an XY table 61 that is driven in the X and Y directions, and a bonding arm 63 is provided on the bonding head 62 so as to be moved up and down. A bonding tool 64 is provided on the distal end of the bonding arm 63. This bonding tool 64 is in the form of a suction nozzle that holds the semiconductor pellet 50 by suction.

This type of die bonding apparatus is disclosed in, for instance, Japanese Patent Application Laid-Open (Kokai) Nos. H4-61241 and H4-312936.

When the semiconductor pellet 50 is placed on the positioning stage 51, it is held by suction on the positioning stage 51. Then, the XY table 55 is driven to move the positioning claw 52 toward the semiconductor pellet 50, and the semiconductor pellet 50 is positioned by the positioning claw 52. Next, the XY table 61 of the bonding device 60 is moved in the Y direction so as to be above the semiconductor pellet 50 on the positioning stage 51, and the bonding tool 64 is lowered to hold the semiconductor pellet 50. The bonding tool 64 is then raised, moved to above the bonding position of the lead frame 53, and then lowered, thus bonding the semiconductor pellet 50 to the lead frame 53.

Figure 6:
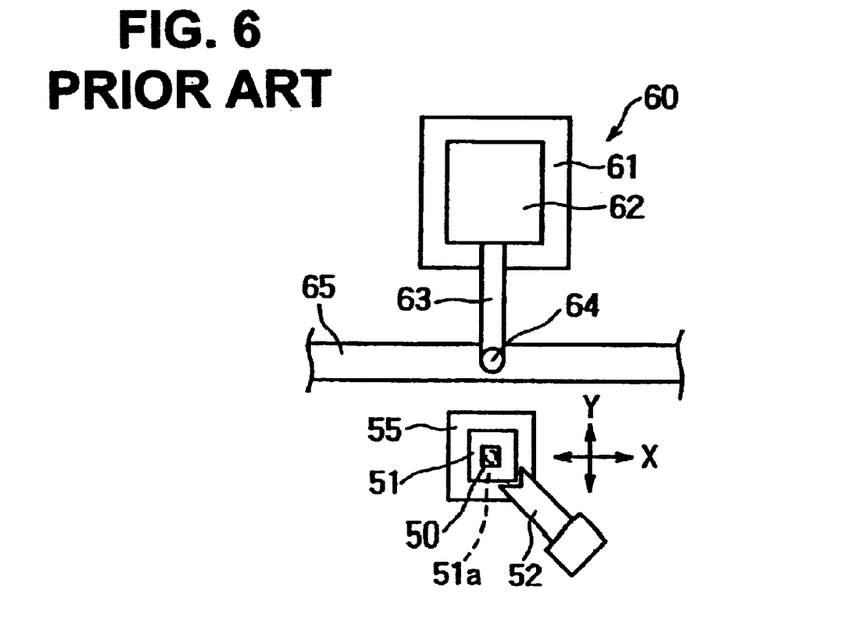
FIG. 6 is a schematic top view of a tape bonding apparatus.

As to a tape bonding apparatus, and particularly an inner lead bonding apparatus, it is structured, as shown in FIG. 6, more or less the same as the die bonding apparatus shown in FIG. 5. In this inner lead bonding apparatus of FIG. 6, however, the positioning claw 52 does not move; and instead the positioning stage 51 is mounted on the XY table 55, and the positioning stage 51 is moved to beneath a carrier tape 65 by the XY table 55. Also, the bonding tool 64 is not a suction nozzle and is shaped such that a lead provided on the carrier tape 65 will be pressed against the semiconductor pellet 50.

Japanese Patent Application Laid-Open (Kokai) No. H2-244735 discloses this type of tape bonding apparatus.

When a semiconductor pellet 50 is placed on the positioning stage 51, it is held by suction on the positioning stage 51. The XY table 55 is driven to move the positioning stage 51 toward the semiconductor pellet 50, and the semiconductor pellet 50 is positioned by the positioning claw 52. The XY table 55 is then driven to move the positioning stage 51 to beneath the carrier tape 65, after which the lead of the carrier tape 65 is pressed against and bonded to the semiconductor pellet 50 by the bonding tool 64 of the bonding device 60.

Figure 7:
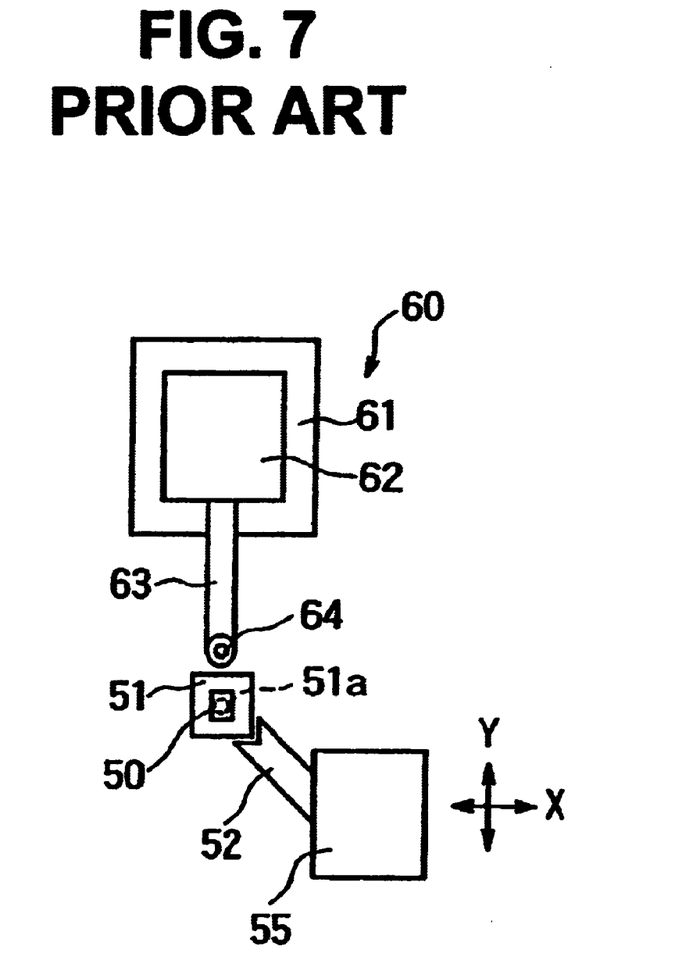
FIG. 7 is a schematic top view of a bump bonding apparatus.

As to a bump bonding apparatus, it is also, as shown in FIG. 7, structured more or less the same as the die bonding apparatus shown in FIG. 5. In this bump bonding apparatus, however, the positioning stage 51 doubles as a bonding stage, and a wire bonding device is used as the bonding device 60. Therefore, a very fine (20 to 30 $\mu$m) wire of gold or solder (not shown) is passed through the bonding tool 64.

When the semiconductor pellet 50 is placed on the positioning stage 51, it is held by suction on the positioning stage 51. The XY table 55 is driven to move the positioning claw 52 toward the semiconductor pellet 50, and the semiconductor pellet 50 is positioned by the positioning claw 52 provided on the XY table 55. A bump is then formed on an electrode of the semiconductor pellet 50 by the bonding device 60. In this bump formation method, a ball formed at the distal end of the wire passing through the bonding tool 64 is pressed against the electrode of the semiconductor pellet, the wire is cut at the base of the ball, and a bump is formed on the electrode of the semiconductor pellet.

An example of this type of bump bonding apparatus can be found in Japanese Patent Application Laid-Open (Kokai) No. H7-86286.

In the above bonding apparatuses, the semiconductor pellet 50 is moved by the positioning claw 52 during the positioning process; accordingly, it is necessary that the positioning stage 51 holds the semiconductor pellet 50 with a weak suction force that allows the semiconductor pellet 50 to be moved. However, since the semiconductor pellet 50 is kept held by this weak suction force in the above bonding apparatuses, there is the danger that the semiconductor pellet 50 is misaligned due to vibration or other reasons as described below.

More specifically, in the die bonding apparatus shown in FIG. 5, the semiconductor pellet 50 positioned by the positioning claw 52 is moved over the lead frame 53 by being held by the bonding tool 64; accordingly, much of a problem would not occur. In the case of the tape bonding apparatus shown in FIG. 6, however, the positioning stage 51 and the semiconductor pellet 50 held thereon are moved to beneath the carrier tape 65; accordingly, the semiconductor pellet 50 is susceptible to misalignment during this movement. In addition, in the case of the bump bonding apparatus shown in FIG. 7, since the formation of the bump is performed by the bonding device 60 on the semiconductor pellet 50 held on the positioning stage 51, the semiconductor pellet 50 is susceptible to misalignment during this bump formation.

SUMMARY OF THE INVENTION

Accordingly, it is an object of the present invention is to provide a semiconductor pellet positioning method and apparatus that prevent the misalignment of a semiconductor pellet once it has been positioned.

The method of the present invention for accomplishing the above object is a semiconductor pellet positioning method in which a positioning stage for holding a semiconductor pellet is moved relative to a positioning claw, and the semiconductor pellet is positioned by the positioning claw; and in the present invention during the positioning of the semiconductor pellet, the semiconductor pellet is held on the positioning stage by a suction force that is weak enough so that the positioning claw can move the semiconductor pellet, and upon completion of the positioning, the semiconductor pellet is held on the positioning stage by a suction force that is stronger than suction force used during the positioning.

The apparatus of the present invention for accomplishing the above object is a semiconductor pellet positioning apparatus that comprises a positioning stage for holding a semiconductor pellet and a positioning claw for positioning the semiconductor pellet by moving relative to this positioning stage; and in the present invention, a suction force control means is further provided so that the semiconductor pellet is held on the positioning stage during the positioning of the semiconductor pellet by a suction force that is weak enough so that the positioning claw can move the semiconductor pellet and that upon completion of the positioning the semiconductor pellet is held on the positioning stage by a suction force that is stronger than the suction force used during the positioning.

DETAILED DESCRIPTION OF THE PREFERRED EMBODIMENTS

Embodiments of the present invention will be described with reference to FIGS. 1 to 4. First, a bump bonding apparatus to which an embodiment of the present invention is applied will be described with reference to FIG. 4.

Figure 4:
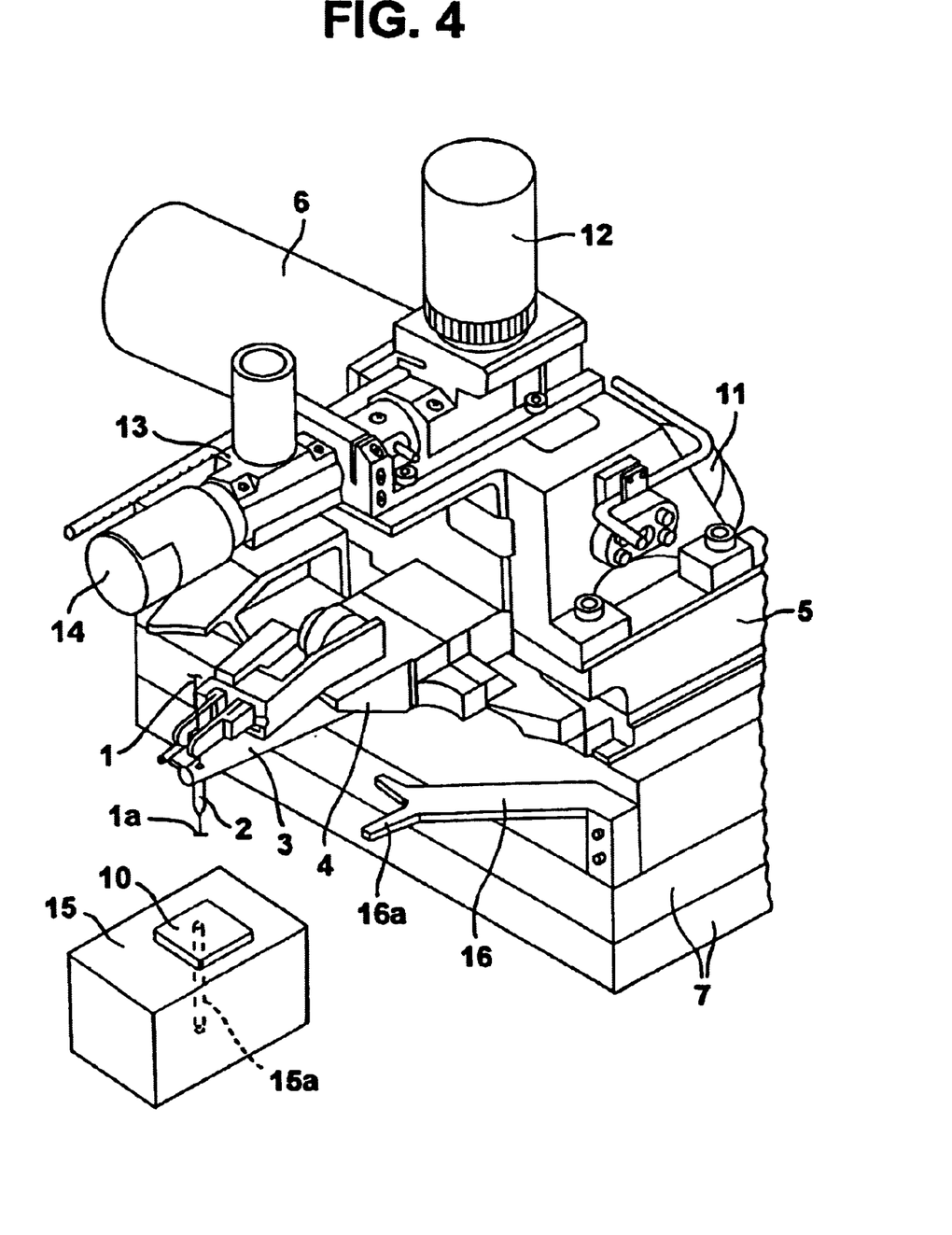
FIG. 4 is a perspective view of an example of a bump bonding apparatus which uses an embodiment of the present invention.

A capillary 2 is provided to one end of a bonding horn 3 so that a wire 1 passes therethrough, and the bonding horn 3 is attached to a lifter arm 4. The lifter arm 4 is mounted to a bonding head 5 so as to be moved up and down or swing and is moved up and down or swung by a Z axis motor 6 that is fixed to the bonding head 5. The bonding head 5 is mounted on an XY table 7.

A bond loading linear motor 11 that provides a bonding load for pressing the ball 1a formed at the distal end of the wire 1 against an electrode of a semiconductor pellet 10 is fixed on its coil side to the lifter arm 4 and on its magnet side to the bottom of the bonding head 5. A detection camera 12 for providing an image of the semiconductor pellet 10 is fixed to the bonding head 5. This detection camera 12 is connected to one end of a horizontally disposed lens barrel 13, and a detection component 14 that incorporates the image of the semiconductor pellet 10 is provided to the other end of the lens barrel 13. The semiconductor pellet 10 is vacuum-held on a positioning stage 15 by a suction hole 15a opened in the positioning stage 15. The positioning stage 15 is used as a bonding stage as well. The structure described above is known and will not be described further.

In the above bump bonding apparatus, a positioning claw 16 is fixed to the XY table 7. The positioning element 16a of the positioning claw 16 extends beneath the bonding horn 3 and to the rear side of the capillary 2, so that the lower surface of the positioning element 16a is located slightly above the upper surface of the positioning stage 15. The positioning element 16a is shaped so as to accommodate the corner of the semiconductor pellet 10 placed on the positioning stage 15.

The suction force control means of the embodiment of the present invention will now be described with reference to FIGS. 1 to 3.

The positioning stage 15 that holds the semiconductor pellet 10 is switchably connected to a vacuum source 21 and a compressed air source 22 via a suction-switching electromagnetic valve 20. In this embodiment, a three-port electromagnetic valve is used as the suction-switching electromagnetic valve 20. Thus, the suction-switching electromagnetic valve 20 has ports P1 and P1' and P2 and P2' on its inlet side, and it further has ports P3 and P3' on its outlet side. Among these ports, the ports P1 and P3 and ports P2' and P3' communicate with each other, but the ports P2 and P1' are closed (thus not communicating with each other).

Figure 1:
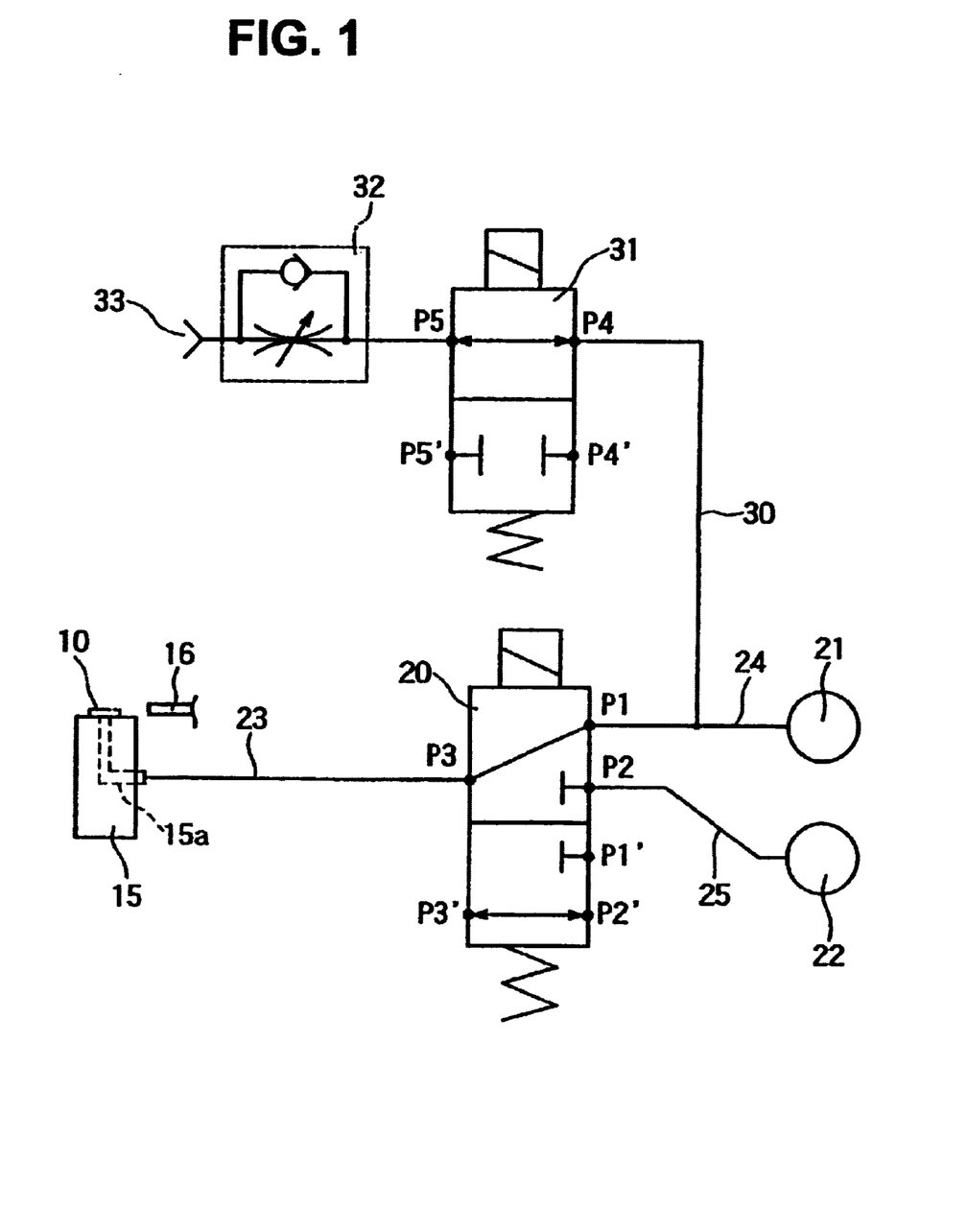
FIG. 1 illustrates the structure of the suction force control means according to one embodiment of the semiconductor pellet positioning apparatus of the present invention, showing the control of the suction during the positioning of the semiconductor pellet.
Figure 2:
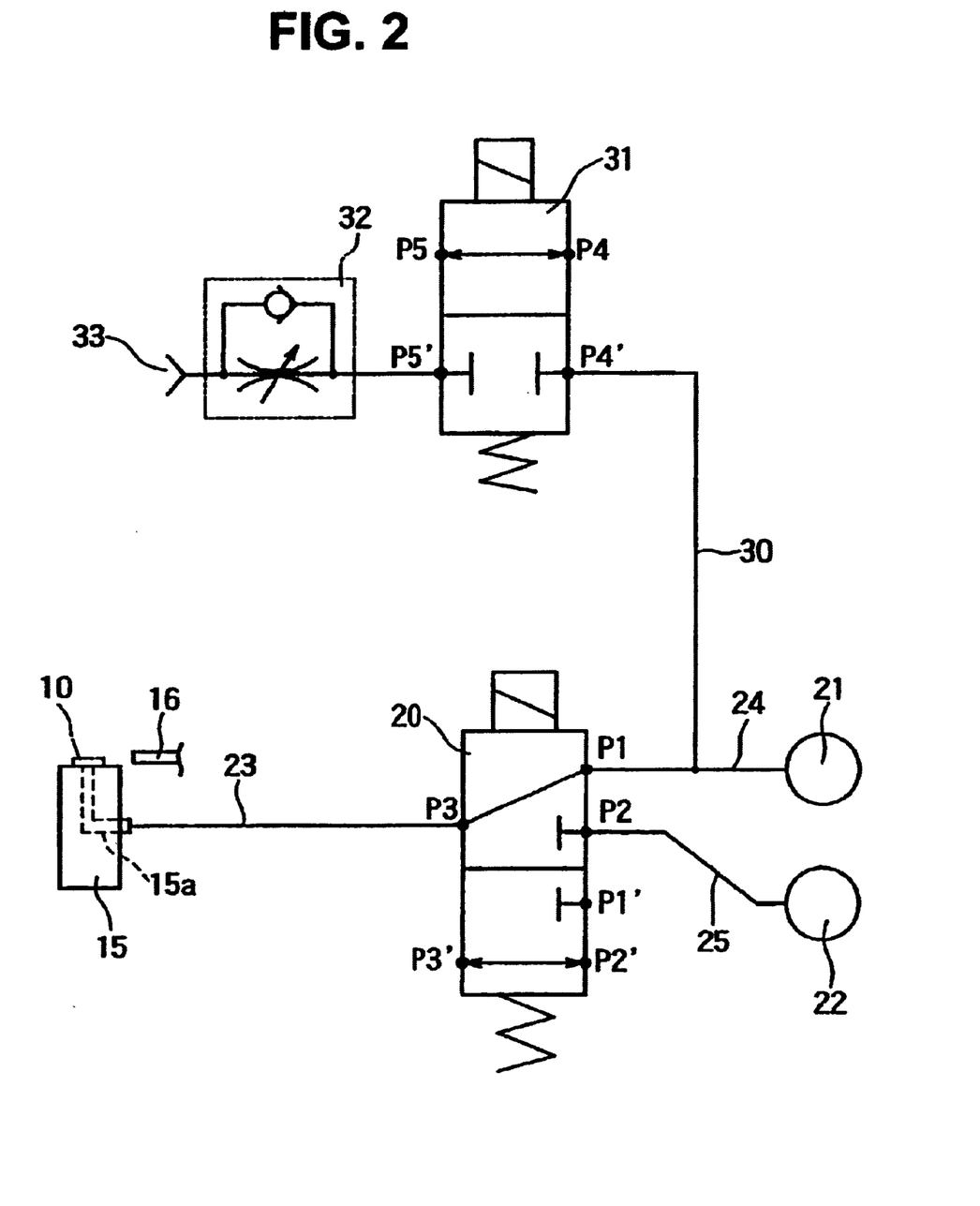
FIG. 2 is a diagram showing the control of the suction upon completion of the positioning.
Figure 3:
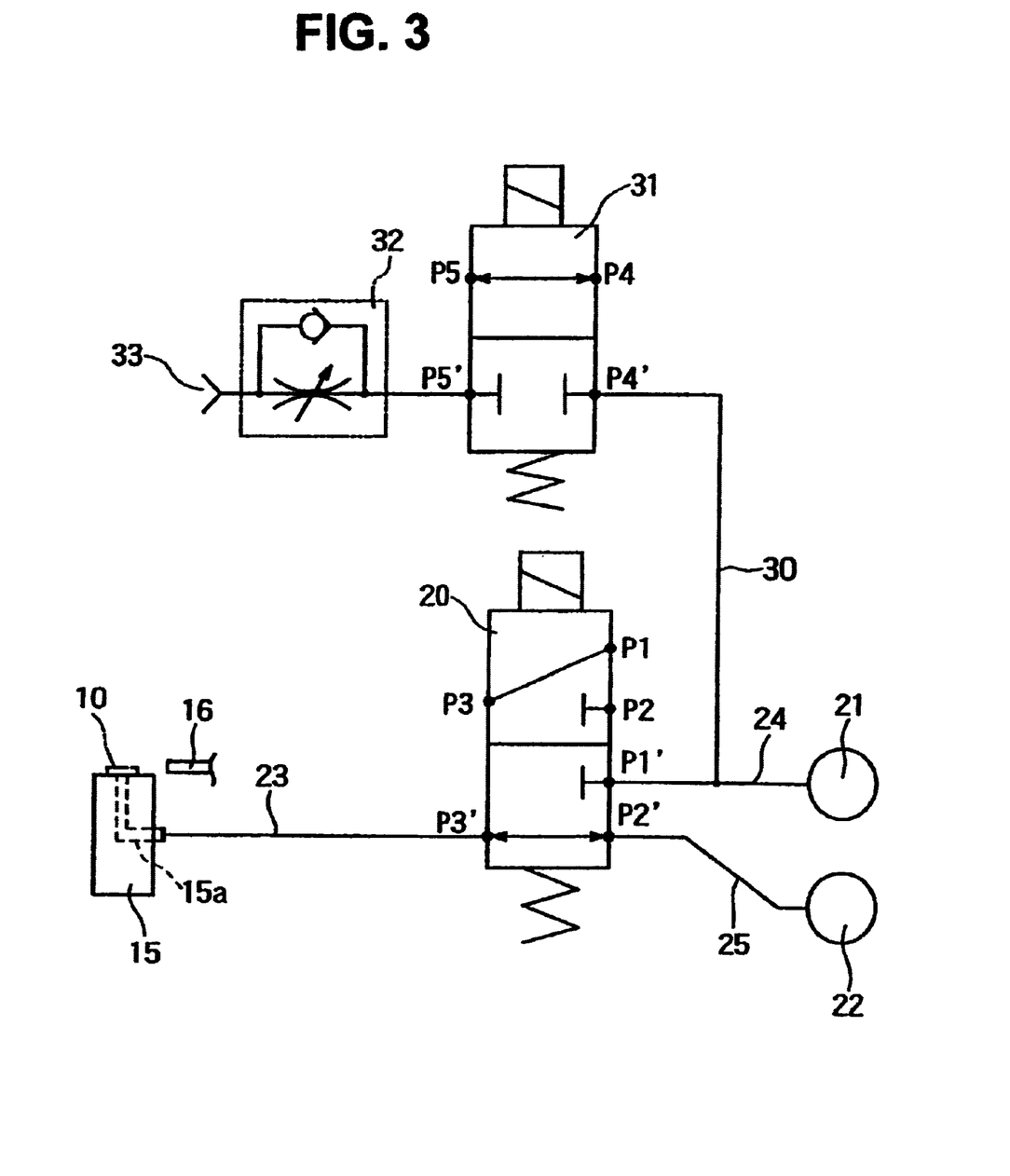
FIG. 3 is a diagram showing the control of the suction during the process of picking-up the semiconductor pellet.

Thus, when the suction-switching electromagnetic valve 20 is on, as shown in FIGS. 1 and 2, the port P3 is connected to and communicates with a pipe 23 that leads to the suction hole 15a of the positioning stage 15, and the ports P1 and P2 are connected to pipes 24 and 25, respectively, leading to the vacuum source 21 and compressed air source 22. Thus, when the suction-switching electromagnetic valve 20 is off, as shown in FIG. 3, the port P3' is connected to the pipe 23, and the ports P1' and P2' are connected to the pipes 24 and 25, respectively.

Furthermore, a pipe 30 is connected to the pipe 24, and the pipe 30 is connected to an atmospheric air inlet 33 via a suction force-adjusting electromagnetic valve 31 and a throttle valve 32. In this embodiment, a two-port electromagnetic valve is used as the suction force-adjusting electromagnetic valve 31. Thus, the suction force-adjusting electromagnetic valve 31 has ports P4 and P4' on its inlet side, and it also has ports P5 and P5' on its outlet side. Here, the ports P4 and P5 communicate with each other, and the ports P4' and P5' are closed (thus not communicating with each other)

When the suction force-adjusting electromagnetic valve 31 is on, as shown in FIG. 1, the port P4 is connected to the pipe 30, and the port P5 is installed so as to connect to the throttle valve 32. When, on the other hand, the suction force-adjusting electromagnetic valve 31 is off, as shown in FIGS. 2 and 3, the port P4' is connected to the pipe 30, and the port P5' is connected to the throttle valve 32.

Before describing the positioning of the semiconductor pellet 10, the action of the suction-switching electromagnetic valve 20 and the suction force-adjusting electromagnetic valve 31 will be explained.

As shown in FIG. 1, when the suction-switching electromagnetic valve 20 and the suction force-adjusting electromagnetic valve 31 are both on, the suction force of the suction hole 15a of the positioning stage 15 is as follows:

When the suction-switching electromagnetic valve 20 is on, the port P1 is connected to the pipe 24, and the port P3 is connected to the pipe 23. Therefore, the suction hole 15a of the positioning stage 15 creates a suction at the level of vacuum pressure of the vacuum source 21. However, since the suction force-adjusting electromagnetic valve 31 is on, the port P4 is connected to the pipe 30, and the port P5 is connected to the throttle valve 32; thus the atmospheric air from the atmospheric air inlet 33 is supplied from the pipe 30 to the pipe 24 through the throttle valve 32 and the suction force-adjusting electromagnetic valve 31. As a result, the vacuum pressure in the pipe 24 produced by the vacuum source 21 is reduced by the atmospheric air adjusted by the throttle valve 32, and this reduced pressure suction force creates a suction from the suction hole 15a of the positioning stage 15 so as to hold the semiconductor pellet 10.

On the other hand, as shown in FIG. 2, when the suction-switching electromagnetic valve 20 is on and the suction force-adjusting electromagnetic valve 31 is off, the suction force of the suction hole 15a of the positioning stage 15 is as follows: When the suction-switching electromagnetic valve 20 is on, as described for the case of FIG. 1, suction is created in the suction hole 15a of the positioning stage 15 at the level of vacuum pressure of the vacuum source 21. However, since the suction force-adjusting electromagnetic valve 31 is off, the port P4' is connected to the pipe 30, and the port P5' is connected to the throttle valve 32. In other words, since the atmospheric air of the atmospheric air inlet 33 is not supplied to the pipe 30, the vacuum pressure of the vacuum source 21 is unchanged (or not reduced), so that suction of the vacuum source 21 is created as is at the suction hole 15a of the positioning stage 15. In other words, the semiconductor pellet 10 is held on the positioning stage 15 by a stronger suction force than that of the semiconductor pellet positioning process described above.

Furthermore, as shown FIG. 3, when the suction-switching electromagnetic valve 20 and the suction force-adjusting electromagnetic valve 31 are both off, the suction force of the suction hole 15a of the positioning stage 15 is as follows: When the suction-switching electromagnetic valve 20 is off, the port P2' is connected to the pipe 25, and the port P3' is connected to the pipe 23. Therefore, the compressed air of the compressed air source 22 is supplied to the suction hole 15a of the positioning stage 15. In this case, since the pipe 24 is not connected to the pipe 23, whether the suction force-adjusting electromagnetic valve 31 is on or off has no effect whatsoever on the compressed air supplied from the compressed air source 22 to the suction hole 15a of the positioning stage 15. In FIG. 3, since the suction force-adjusting electromagnetic valve 31 is off, as described for FIG. 2, the atmospheric air of the atmospheric air inlet 33 is not supplied to the pipe 30.

With the above-described structure, the vacuum pressure of the vacuum source 21 can be set at, for instance, approximately 500 to 650 mmHg; and the throttle valve 32 can be adjusted before hand so that the vacuum pressure at the suction hole 15a of the positioning stage 15 is approximately 200 to 350 mmHg, which is a reduced vacuum pressure level effected by the atmospheric air supplied from the atmospheric air inlet 33 as in FIG. 1. This reduced, weak vacuum pressure is a suction force that allows the semiconductor pellet 10 to be moved by the positioning claw 16 (described below) but will not damage the semiconductor pellet 10.

The positioning of the semiconductor pellet 10 performed after the above setting will now be described.

First, a semiconductor pellet 10 is picked up by a pick-up and conveyance means (not shown) from a tray or wafer (not shown) and conveyed to and placed on the positioning stage 15. Once the conveyance of the semiconductor pellet 10 to the positioning stage 15 begins, the suction-switching electromagnetic valve 20 and the suction force-adjusting electromagnetic valve 31 are both turned on as shown in FIG. 1. When the suction-switching electromagnetic valve 20 and the suction force-adjusting electromagnetic valve 31 are both on, this results in a suction state produced by a weak vacuum pressure at the suction hole 15a of the positioning stage 15 as discussed above.

The XY table 7 is then driven such that the positioning element 16a of the positioning claw 16 pushes on the corner of the semiconductor pellet 10.

When the positioning element 16a of the positioning claw 16 has pushed the semiconductor pellet 10 to a predetermined position, the suction-switching electromagnetic valve 20 stays on and the suction force-adjusting electromagnetic valve 31 is turned off as shown in FIG. 2. As a result, suction is created in the suction hole 15a of the positioning stage 15 at the vacuum pressure of the vacuum source 21 as described above. In other words, the weak vacuum is switched to a strong vacuum, and the semiconductor pellet 10 is firmly held to the positioning stage 15.

The XY table 7 is then driven such that the detection component 14 of the lens barrel 13 is positioned above the semiconductor pellet 10. As a result, the positioning claw 16 retracts from above the positioning stage 15.

After this, an image of the electrode on the semiconductor pellet 10, which is the bonding location, is taken by the detection camera 12 via the detection component 14 and the lens barrel 13, the ball 1a formed at the distal end of the wire 1 is bonded at the bonding location on the electrode of the semiconductor pellet 10, and after this bonding the wire 1 is cut at the base of the ball 1a. Thus, a bump is formed on the electrode of the semiconductor pellet 10.

Once the formation of the bump on the semiconductor pellet 10 is complete, the semiconductor pellet 10 is taken out from the positioning stage 15. This operation involves moving the suction nozzle (not shown) to above the positioning stage 15, then lowering it and moving it to a position approximately 0.03 to 0.1 mm over the semiconductor pellet 10. The suction force-adjusting electromagnetic valve 31 is kept off and the suction-switching electromagnetic valve 20 is turned off as shown in FIG. 3. When the suction-switching electromagnetic valve 20 is turned off, a small amount of compressed air is supplied from the compressed air source 22 to the suction hole 15a of the positioning stage 15, and the suction nozzle picks up and holds the semiconductor pellet 10. The suction nozzle then moves the semiconductor pellet 10 to the specified place.

The above embodiment is described with reference to a bump bonding apparatus, and the positioning claw 16 is provided on the XY table 7. However, the suction force control means of the present invention can be applied to the positioning stage 51 of the bump bonding apparatus shown in FIG. 7 in which the positioning claw 52 is provided on the XY table which is independent from the bonding head 62.

It should go without saying that the suction force control means can also be applied to the positioning stage 51 of the die bonding apparatus shown in FIG. 5 and that of the tape bonding apparatus shown in FIG. 6.

As seen from the above, during the positioning of the semiconductor pellet 10, the semiconductor pellet 10 is held to the positioning stage 15 at a suction force weak enough that the semiconductor pellet 10 can be moved by the positioning claw 16; but upon completion of the positioning, the semiconductor pellet 10 is held to the positioning stage 15 at a suction force that is stronger than the above-described weak suction force. As a result, misalignment of the semiconductor pellet 10 after it has been positioned is prevented.

Also, there is no need for a positioning stage to have a bulky construction since the positioning claw 16 is provided on the XY table 7. Furthermore, since the positioning claw 16 is driven by the XY table 7, which is a part of the bonding apparatus itself, there is no need for the drive means of the positioning claw 16 to have a bulky construction, either. The apparatus is therefore simpler and less expensive. Though the positioning claw 16 is provided on the XY table 7, it may instead be provided on the bonding head 5 mounted on the XY table 7 or on any member fixed to the bonding head 5.

As seen from the above, according to the present invention, during the positioning of the semiconductor pellet, the semiconductor pellet is held on the positioning stage by suction that is weak but enough for the semiconductor pellet to be moved by the positioning claw; but once the positioning by the positioning claw is completed, the semiconductor pellet is held on the positioning stage by suction that is strong enough for semiconductor pellet to be immovable, so that misalignment of the semiconductor pellet after it has been positioned is prevented.

Also, when the positioning claw for positioning a semiconductor pellet on the positioning stage is provided on the bonding head or on the XY table on which the bonding head is mounted, the semiconductor pellet positioning stage and positioning claw, the positioning drive means for the positioning stage, and so on do not have a bulky construction; and the cost of the apparatus can be reduced.

What is claimed is:

1. A semiconductor pellet positioning method comprising holding a semiconductor pellet by means of suction force applied to said semiconductor pellet on a positioning stage, moving said semiconductor pellet relative to a positioning claw, and positioning the semiconductor pellet by said positioning claw, wherein said semiconductor pellet positioning method comprises: holding said semiconductor pellet on said positioning stage by applying to an under surface of said semiconductor pellet a first suction force with which said positioning claw can move said semiconductor pellet during a positioning of said semiconductor pellet, said first suction force being set by a suction force control means; and after completion of said positioning, holding said semiconductor pellet to said positioning stage by applying to said under surface of said semiconductor pellet a second suction force that is stronger than said first suction force, said second suction force being set by said suction force control means; and wherein said suction force control means comprises a three port electromagnetic valve having a vacuum source and a compressed air source coupled respectively to an input side of said three port electromagnetic valve and an outlet side coupled to said positioning stage for holding said semiconductor pellet.

* * * * *